United States Patent
Shinjo et al.

(10) Patent No.: US 6,650,181 B2
(45) Date of Patent: Nov. 18, 2003

(54) HIGH-FREQUENCY AMPLIFIER (75) Inventors: Shintaro Shinjo, Tokyo (JP);
Kazutomi Mori, Tokyo (JP); Hiroyuki Joba, Tokyo (JP); Hiroaki Nagano, Tokyo (JP); Mitsuru Motizuki, Tokyo (JP); Yukio Ikeda, Tokyo (JP); Noriharu Suematsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/069,601
(22) PCT Filed: Jun. 29, 2001
(86) PCT No.: PCT/JP01/05666
§ 371 (c)(1),
(2), (4) Date: Jun. 25, 2002
(87) PCT Pub. No.: WO02/03545
PCT Pub. Date: Jan. 10, 2002

(65) Prior Publication Data
US 2002/0171483 A1 Nov. 21, 2002

(30) Foreign Application Priority Data
Jun. 30, 2000 (WO) ................................. PCT/JP00/04368

(51) Int. Cl.$^7$ ................................................. H03G 3/20
(52) U.S. Cl. .................... 330/136; 330/140; 330/285
(58) Field of Search ............................... 330/129, 136, 330/140, 285, 296

(56) References Cited

U.S. PATENT DOCUMENTS

| 5,138,274 A | * | 8/1992 | Nakanishi et al. | ........... 330/136 |
| 5,196,807 A | | 3/1993 | Fujisawa | ..................... 330/254 |
| 5,410,275 A | | 4/1995 | Black | ........................ 330/288 |

FOREIGN PATENT DOCUMENTS

| JP | 56-80906 | 7/1981 |
| JP | 58-178612 | 10/1983 |
| JP | 116719/1985 | 8/1985 |
| JP | 62-274906 | 11/1987 |
| JP | 2-149108 | 6/1990 |
| JP | 5-308232 | 11/1993 |
| JP | 9-107299 | 4/1997 |
| JP | 2000-59157 | 2/2000 |

OTHER PUBLICATIONS

Tetsuo Sato et al.: "Intelligent RF Power Module Using Automatic Bias Control (ABC) System for PCS CDMA Applications" IEEE MTT–S. Microwave Symp. Dig., pp. 201–204 1998.

* cited by examiner

Primary Examiner—Steven J. Mottola
(74) Attorney, Agent, or Firm—Oblon, Spivak, McClelland, Maier & Neustadt, P.C.

(57) ABSTRACT

A high-frequency amplifying unit 2 in which a steep gain variation developed according to a change in the amplitude of input high-frequency signal is suppressed is provided. It amplifies an input high-frequency signal with a transistor 12 at the same time a measuring circuit 27 measures amplitude of the input high-frequency signal, and a bias control circuit 26 continuously controls a bias applied to the transistor 12 according to the value of amplitude measured by the measuring circuit 27. Thus it is possible to suppress a steep gain variation produced according to a variation in the amplitude of input high-frequency signal.

7 Claims, 11 Drawing Sheets

CURRENT OF
BIAS CIRCUIT

POWER OF INPUT SIGNAL

HIGH-FREQUENCY AMPLIFIER

BACKGROUND OF THE INVENTION

1. Field of the Invention

The present invention relates to a high-frequency amplifying device that is used in a mobile communication terminal and the like and amplifies a high-frequency signal.

2. Description of the Related Art

Figure 1:
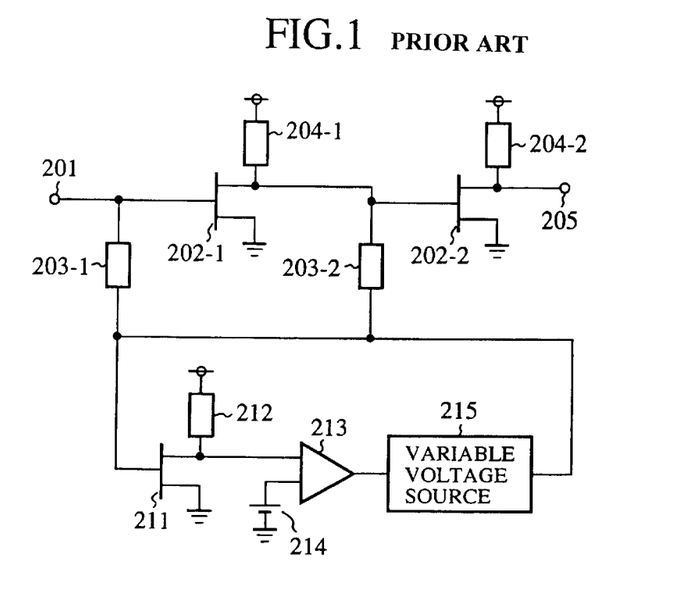
FIG. 1 is a block diagram showing a configuration of conventional high-frequency amplifying device.

FIG. 1 is a block diagram showing a configuration of conventional high-frequency amplifying device described in, for example, "Intelligent RF Power Module Using Automatic Bias Control (ABC) System for PCS CDMA Applications" (Sato et al., IEEE MTT-S Int. Microwave Symp. Dig. p.p.201–204, 1998). In the figure, reference numeral 201 indicates an input terminal, and 202-1 indicates a first-stage transistor for amplifying a high-frequency signal. 202-2 indicates a second-stage transistor for amplifying the high-frequency signal, and 203-1 indicates a bias feed circuit such as a distributed constant circuit, a resistor, an inductor, a capacitor or the like for biasing the input of transistor 202-1. 203-2 indicates a bias feed circuit for biasing the input of transistor 202-2, and 204-1 indicates a pull-up circuit provided on the output side of transistor 202-1. 204-2 indicates a pull-up circuit provided on the output side of transistor 202-2, and 205 indicates an output terminal, respectively.

Reference numeral 211 indicates a transistor for detecting an input signal, 212 indicates a pull-up circuit on the output side of transistor 211, and 213 indicates a comparator for comparing a reference voltage generated by a reference voltage source 214 and the voltage of signal detected by the transistor 211. Reference numeral 214 indicates the reference voltage source for generating a predetermined reference voltage, and 215 indicates a variable voltage source for applying a voltage corresponding to the result of comparison by the comparator 213 to each of the bias feed circuits 203-1 and 203-2.

The operation will next be described.

A high-frequency signal supplied via the input terminal 201 is amplified by the transistors 202-1 and 202-2 and the post-amplification high-frequency signal is output through the output terminal 205.

On the other hand, the transistor 211 detects the high-frequency signal supplied via the input terminal 201 and supplies the post-detection signal to the comparator 213. The comparator 213 compares the reference voltage generated by the reference voltage source 214 and the voltage of signal detected by the transistor 211 and supplies a signal (e.g., a signal of 0 or 1) indicative of whether the voltage of post-detection signal is higher than the reference voltage, to the variable voltage source 215. The variable voltage source 215 selects a voltage to be applied to each of the bias feed circuits 203-1 and 203-2 according to whether or not the voltage of input signal is higher than the reference voltage.

Thus the biases to be applied to the transistors 202-1 and 202-2 are changed according to the voltage (power) of input signal to reduce power consumption at low output power.

However, because the conventional high-frequency amplifying device is constructed as described above, it is accompanied by problems that a variation in gain at their changing is large and a further reduction in power consumption becomes difficult, for example, since the biases to be applied to the transistors are changed discontinuously based on whether or not the voltage of input signal is higher than the reference voltage. There is a possibility that when the variation in gain at the changing is large, a shift will occur in the phase of a signal, thus causing defective conditions upon detection. When a system, such as a W-CDMA (Wideband Code Division Multiple Access) system placed under strict constraints to a gain fluctuation band, is used in a communication apparatus or the like, it is difficult to meet such constraints when the gain variation at the changing is large.

The present invention has been made to solve the foregoing problems, therefore the present invention aims to provide a high-frequency amplifying device comprising a high-frequency amplifying unit having a one-stage amplifying element for amplifying input high-frequency signal, a measuring circuit for measuring the amplitude of input high-frequency signal, and a bias control circuit for continuously controlling a bias applied to the amplifying element according to the value of amplitude measured by the measuring circuit, whereby a steep gain variation produce by a change in the amplitude of input high-frequency signal can be suppressed.

SUMMARY OF THE INVENTION

A high-frequency amplifying device according to the present invention comprises a high-frequency amplifying unit having an amplifying element for amplifying the input high-frequency signal; a measuring circuit for measuring amplitude of the input high-frequency signal; and a bias control circuit for continuously controlling a bias applied to the amplifying element according to value of the amplitude measured by the measuring circuit. Thus an effect is obtained that a steep gain variation produce by a change in the amplitude of input high-frequency signal can be suppressed.

In accordance with the high-frequency amplifying device according to the present invention, the bias control circuit has a current adding circuit for outputting a current having a value corresponding to the amplitude measured by the measuring circuit, and a bias applying circuit for applying a bias corresponding to sum of the current output from the current adding circuit and a predetermined reference current to the amplifying element. Thus an effect is obtained that when the amplitude of input high-frequency signal becomes small, the bias can be reduced continuously and power consumption at low output power can be further reduced.

In accordance with the high-frequency amplifying device according to the present invention, the bias control circuit has a detection adjusting circuit for setting value of conducting current according to amplitude of the high-frequency signal when the measuring circuit measures the amplitude thereof. Thus an effect is obtained that an operating condition for the measuring circuit can be controlled and an adjustment of the device can be carried out with ease.

In accordance with the high-frequency amplifying device according to the present invention, the current adding circuit has a current mirror circuit for allowing a current having a value corresponding to the amplitude measured by the measuring circuit to conduct into one end thereof, and according to the current, outputting another current set based on a ratio between junction areas of the current mirror circuit and a source voltage from the other end thereof. Thus an effect is obtained that the characteristics of current to the bias applying circuit with respect to the amplitude of input high-frequency signal can be adjusted easier by adjusting the ratio between the junction areas of current mirror circuit and the source voltage thereof, and hence the bias applied to the amplifying element can be adjusted with ease.

In accordance with the high-frequency amplifying device according to the present invention, the bias applying circuit has an internal amplifying element for conducting the current output from the current adding circuit and the predetermined reference current, and the internal amplifying element and the amplifying element of the high-frequency amplifying unit constitute a current mirror circuit.

In accordance with the high-frequency amplifying device according to the present invention, the bias control circuit has a current subtracting circuit for inputting thereto a current having a value corresponding to the amplitude measured by the measuring circuit, and a bias applying circuit for supplying the current to the current subtracting circuit and applying a bias corresponding to a difference between a predetermined reference current and the current to the amplifying element. Thus an effect is obtained that it is possible to continuously increase the bias when the input high-frequency signal is reduced in amplitude, and thereby compensate for a gain reduction at low output power.

In accordance with the high-frequency amplifying device according to the present invention, the bias control circuit has a detection adjusting circuit for setting a value of conducting current according to the amplitude of high-frequency signal when the measuring circuit measures the amplitude thereof. Thus an effect is obtained that an operating condition for the measuring circuit can be controlled, and hence an adjustment of the device can easily be performed.

In accordance with the high-frequency amplifying device according to the present invention, the current subtracting circuit has a current mirror circuit for allowing a current having a value corresponding to the amplitude measured by the measuring circuit to conduct into one end thereof and according to the current, inputting another current set based on a ratio between junction areas of the current mirror circuit and a source voltage from the other end thereof. Thus an effect is obtained that the characteristics of current from the bias applying circuit with respect to the amplitude of input high-frequency signal can be adjusted easier by adjusting ratio between the junction areas of current mirror circuit and the source voltage thereof, and hence the bias applied to the amplifying element can be adjusted with ease.

In accordance with the high-frequency amplifying device according to the present invention, the bias applying circuit has an internal amplifying element for conducting the remaining current obtained by subtracting the current supplied to the current subtracting circuit from the predetermined reference current, and the internal amplifying element and the amplifying element of the high-frequency amplifying unit constitute a current mirror circuit.

In accordance with the high-frequency amplifying device according to the present invention, the measuring circuit is connected in parallel with the high-frequency amplifying unit. Thus an effect is obtained that the amplitude of high-frequency signal can be measured without degradation of the high-frequency signal supplied to the high-frequency amplifying unit.

In accordance with the high-frequency amplifying device according to the present invention, the measuring circuit, the current adding circuit and the detection adjusting circuit are connected in parallel with the high-frequency amplifying unit. Thus an effect is obtained that the measuring circuit, the detection adjusting circuit and the current subtracting circuit can be implemented in a one-chip integrated circuit, thus it makes possible to reduce the scale and cost of the device.

In accordance with the high-frequency amplifying device according to the present invention, the measuring circuit, the current subtracting circuit and the detection adjusting circuit are connected in parallel with the high-frequency amplifying unit. Thus an effect is obtained that the measuring circuit, the detection adjusting circuit and the current subtracting circuit can be implemented in a one-chip integrated circuit, thus it makes possible to reduce the scale and cost of the device.

In accordance with the high-frequency amplifying device according to the present invention, the measuring circuit has a detector circuit connected in series with the high-frequency amplifying unit, for passing a high-frequency signal to the high-frequency amplifying unit and detecting the high-frequency signal. Thus an effect is obtained that it is not necessary to additionally provide a divider for allowing the high-frequency signal to divide to the measuring circuit and the high-frequency amplifying unit, and hence a circuit scale can be reduced.

DETAILED DESCRIPTION OF THE PREFERRED EMBODIMENT

In order to describe the present invention in more details, best modes for carrying out the present invention will hereafter be described with reference to the accompanying drawings.

Embodiment 1

Figure 2:
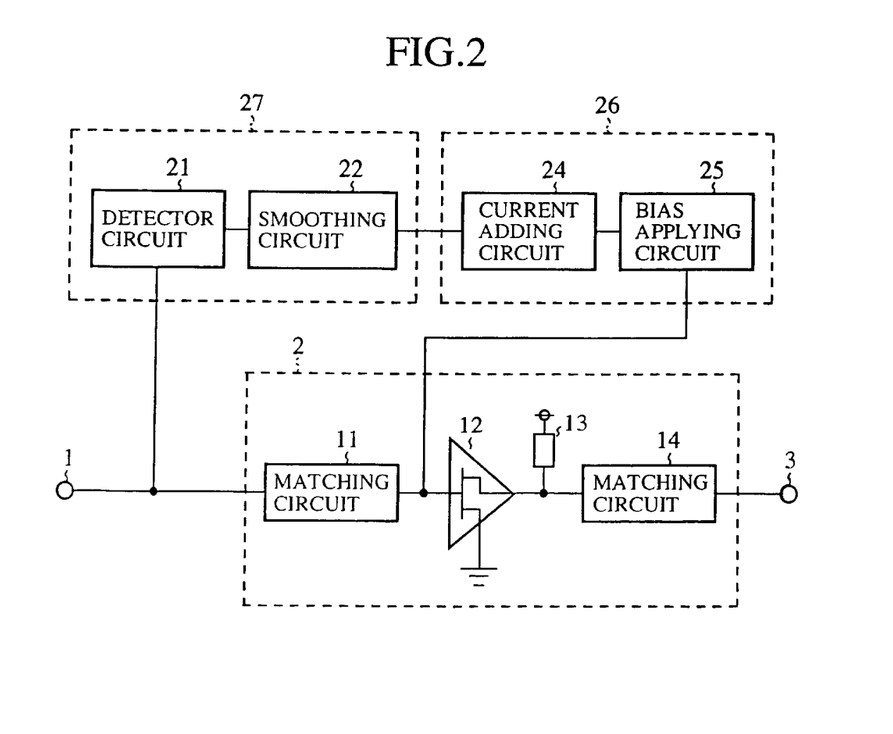
FIG. 2 is a block diagram showing a configuration of high-frequency amplifying device according to an embodiment 1 of the present invention.

FIG. 2 is a block diagram showing a configuration of high-frequency amplifying device according to an embodiment 1 of the present invention. In the figure, reference numeral 1 indicates an input terminal, 2 indicates a high-frequency amplifying unit having a transistor 12 of one stage, and 3 indicates an output terminal.

In the high-frequency amplifying unit 2, reference numeral 11 indicates a matching circuit provided at a stage prior to the transistor 12, 12 indicates the transistor (amplifying element) for amplifying a high-frequency signal, 13 indicates a pull-up circuit provided at the output of transistor 12, and 14 indicates a matching circuit provided at a stage prior to the output terminal 3.

Reference numeral 21 indicates a detector circuit such as a diode for detecting an input signal, and 22 indicates a smoothing circuit such as a capacitor for smoothing a post-detection signal. Incidentally, the detector circuit 21 and the smoothing circuit 22 constitute a measuring circuit 27 for measuring amplitude of the input signal.

Reference numeral 24 indicates a current adding circuit for supplying a current with a value corresponding to the amplitude of input signal to a bias applying circuit 25, based on the current obtained by the detector circuit 21 and the smoothing circuit 22, and 25 indicates a bias applying circuit for adding the current supplied by the current adding circuit 24 to a reference current and applying a bias corresponding to the post-addition current to the base of transistor 12. Incidentally, the current adding circuit 24, and the bias applying circuit 25 constitute a bias control circuit 26.

Figure 3:
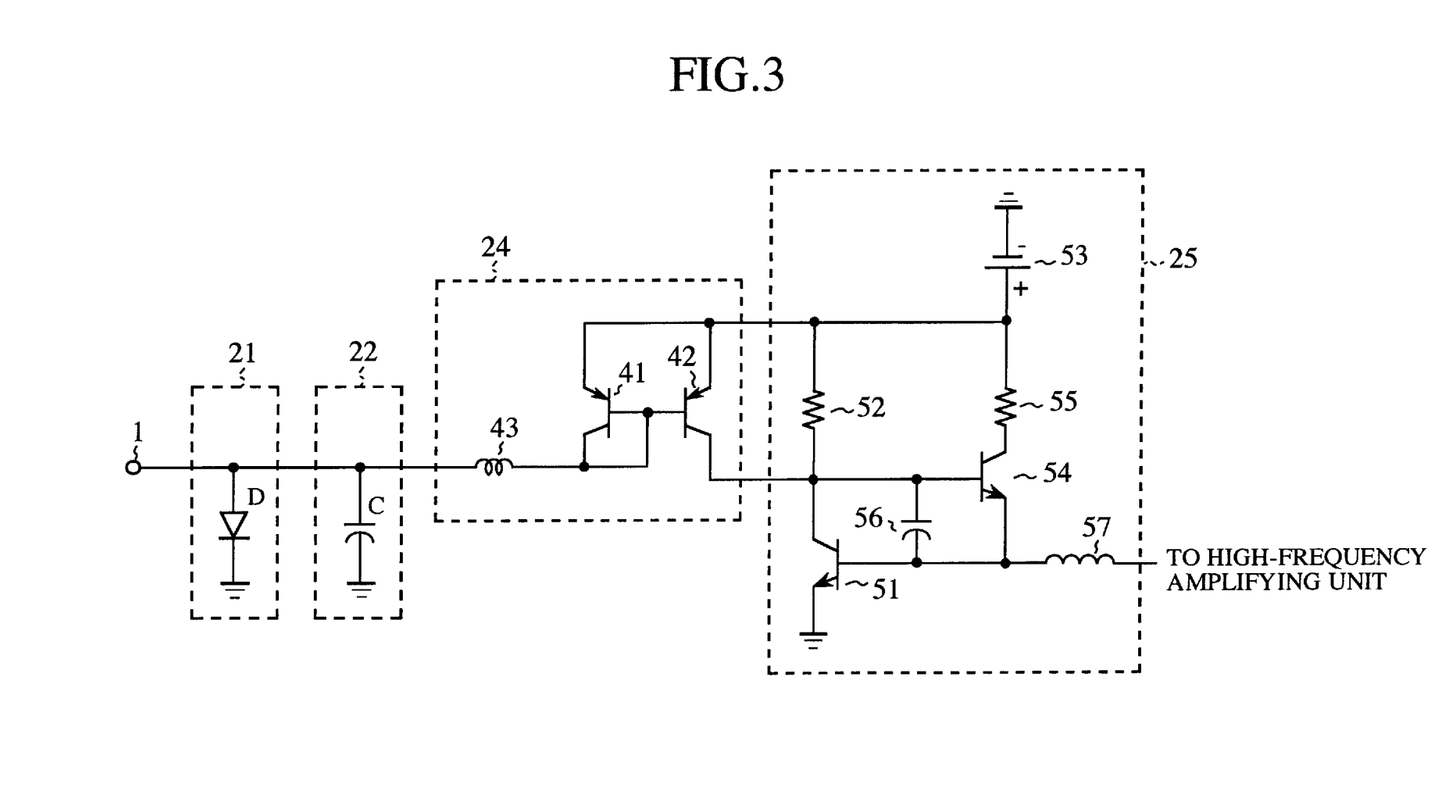
FIG. 3 is a circuit diagram showing an example illustrative of configurations of the current adding circuit and the bias applying circuit shown in FIG. 2.

An example illustrative of configurations of the current adding circuit 24 and the bias applying circuit 25 when an N type bipolar transistor is used as the transistor 12, will be shown hereafter. FIG. 3 is a circuit diagram showing the example illustrative of configurations of the current adding circuit 24 and the bias applying circuit 25 shown in FIG. 2.

In the current adding circuit 24 shown in FIG. 3, reference numerals 41 and 42 indicate P type transistors that constitute a current mirror circuit whose one end is connected to the smoothing circuit 22 through an inductor 43 and whose other ends are connected to the bias applying circuit 25. Emitters of the P type transistors 41 and 42 are connected to a power supply 53 of the bias applying circuit 25. Reference numeral 43 indicates the inductor for suppressing the inflow of high-frequency signal. Incidentally, a current mirror circuit conducts a current through one end thereof and the other end thereof at the same ratio as that between junction areas of transistors, an N type transistor-based current mirror circuit allows current to flow in from one end thereof and the other end thereof, and a P type transistor-based current mirror circuit allows current to flow out from one end thereof and the other end thereof. The detector circuit 21 comprises a diode D as shown in FIG. 3 by way of example, and the smoothing circuit 22 is made up of a capacitor C as shown in FIG. 3 by way of example. Incidentally, capacitance value of the capacitor C is set according to chip rate of the high-frequency signal, and so on. The capacitor C serves so as to smooth a post-detection signal and suppress the flowing of high-frequency signal into the bias control circuit 26.

In the bias applying circuit 25 shown in FIG. 3, reference numeral 51 indicates an N type transistor (internal amplifying element) whose collector is connected to the current adding circuit 24 and whose emitter is grounded, 52 indicates a resistor provided between the collector of N type transistor 51 and the power supply 53, 53 indicates the power supply, 54 indicates an N type transistor whose base is connected to the collector of N type transistor 51 and whose emitter is connected to the base of N type transistor 51, 55 indicates a resistor provided between the collector of N type transistor 54 and the power supply 53, 56 indicates a capacitor, and 57 indicates an inductor which is provided between the base of N type transistor 51 and the base of transistor 12 of the high-frequency amplifying unit 2 to suppress the flowing of high-frequency signal from the high-frequency amplifying unit 2, respectively. Incidentally, the N type transistor 51 constitutes a current mirror circuit together with the N type transistor 12 of the high-frequency amplifying unit 2.

The operation will next be described.

The high-frequency signal supplied via the input terminal 1 is amplified by the transistor 12 of high-frequency amplifying unit 2 and the amplified high-frequency signal is output through the output terminal 3.

On the other hand, the detector circuit 21 detects the high-frequency signal supplied via the input terminal 1 and supplies the post-detection signal to the smoothing circuit 22. The smoothing circuit 22 smoothes the signal. The current adding circuit 24 supplies a current with a value corresponding to the amplitude of input signal to the bias applying circuit 25, based on the post-smoothing signal. The bias applying circuit 25 adds the current supplied by the current adding circuit 24 to the reference current and applies a bias corresponding to the so-added current to the base of transistor 12. Thus when the amplitude of input signal increases, the post-addition current increases and the bias applied to the base of transistor 12 becomes large. On the other hand, when the amplitude of input signal decreases, the post-addition current is reduced and the bias applied to the base of transistor 12 becomes small.

A description will now be made on operation in the case where the respective parts are configured as shown in FIG. 3.

First, the detector circuit 21 and the smoothing circuit 22 extract the voltage amplitude of input signal and allow a current corresponding to it to conduct into the P type transistor 41 of current mirror circuit in the current adding circuit 24. Thus a current with a value obtained by multiplying the current with a ratio between junction areas of the P type transistors 41 and 42 is allowed to conduct into the P type transistor 42 of the current mirror circuit.

In the bias applying circuit 25, a reference bias for the N type transistor 51 is determined according to a voltage from the power supply 53, a resistance value of the resistor 52 and an emitter-to-base voltage of the N type transistor 54 when no current is supplied by the current adding circuit 24. A reference current corresponding to the reference bias serves to make continuity between the collector and emitter. When the current is supplied by the current adding circuit 24, the current is added to the reference current, followed by flowing into the collector of N type transistor 51 of the bias applying circuit 25. The bias applied to base of N type transistor 51 also varies according to a change in the emitter-to-collector current. Since the N type transistor 51 constitutes a current mirror circuit together with the transistor 12 of high-frequency amplifying unit 2, the bias applied to the base of transistor 12 of the high-frequency amplifying unit 2 also changes in the same manner as described above.

Figure 4:
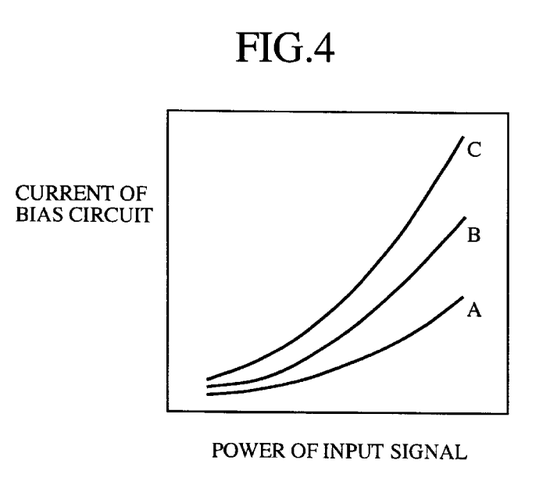
FIG. 4 is a diagram typically showing one example illustrative of characteristics of current passing an N type transistor of the bias applying circuit employed in the embodiment 1.

FIG. 4 is a diagram typically showing one example illustrative of characteristics of currents passing the N type transistor 51 of bias applying circuit 25 employed in the embodiment 1. In the drawing, characteristics A, B and C respectively show relationship between the power of input signal and the current passing the N type transistor 51 where the ratio between the emitter junction areas of current mirror circuit in the current adding circuit 24 is given as 1:1, 1:2 and 1:3. Thus the suitable setting of ratio between the emitter junction areas of current mirror circuit in the current adding circuit 24 makes it possible to implement desired bias control of the transistor 12.

Thus the detector circuit 21, the smoothing circuit 22, the current adding circuit 24 and the bias applying circuit 25 continuously adjust the bias for the transistor 12 of high-frequency amplifying unit 2 according to the amplitude of input signal.

Thus according to the embodiment 1, an effect is obtained that a steep gain variation produced by change in the amplitude of input high-frequency signal can be suppressed, since the high-frequency amplifying unit 2 having the transistor 12 for amplifying the input high-frequency signal, the measuring circuit 27 for measuring the amplitude of input high-frequency signal, and the bias control circuit 26 for continuously controlling the bias applied to the transistor 12 according to the value of amplitude measured by the measuring circuit 27 are provided.

Further according to the embodiment 1, an effect is obtained that the bias can be lowered continuously when the amplitude of input high-frequency signal is reduced, thus it makes possible to further reduce power consumption at low output power, since the bias control circuit 26 has the current adding circuit 24 for outputting the current having the value corresponding to the amplitude measured by the measuring circuit 27, and the bias applying circuit 25 for applying the bias corresponding to the sum of current from the current adding circuit 24 and the predetermined reference current to the transistor 12.

Furthermore according to the embodiment 1, an effect is obtained that the characteristics of current to the bias applying circuit 25 with respect to the amplitude of input high-frequency signal can easily be adjusted by adjusting the ratio between the junction areas of current mirror circuit, and hence the bias applied to the transistor 12 can be adjusted with ease, since the current adding circuit 24 has the current mirror circuit for allowing the current of value corresponding to the amplitude measured by the measuring circuit to conduct into one end thereof and outputting the current set based on the ratio between the junction areas of current mirror circuit from the other end thereof according to the above current.

Still further according to the embodiment 1, an effect is obtained that the measuring circuit 27 can measure the amplitude of high-frequency signal without degradation of the high-frequency signal supplied to the high-frequency amplifying unit 2 since the measuring circuit 27 is connected in parallel with the high-frequency amplifying unit 2.

Embodiment 2

Figure 5:
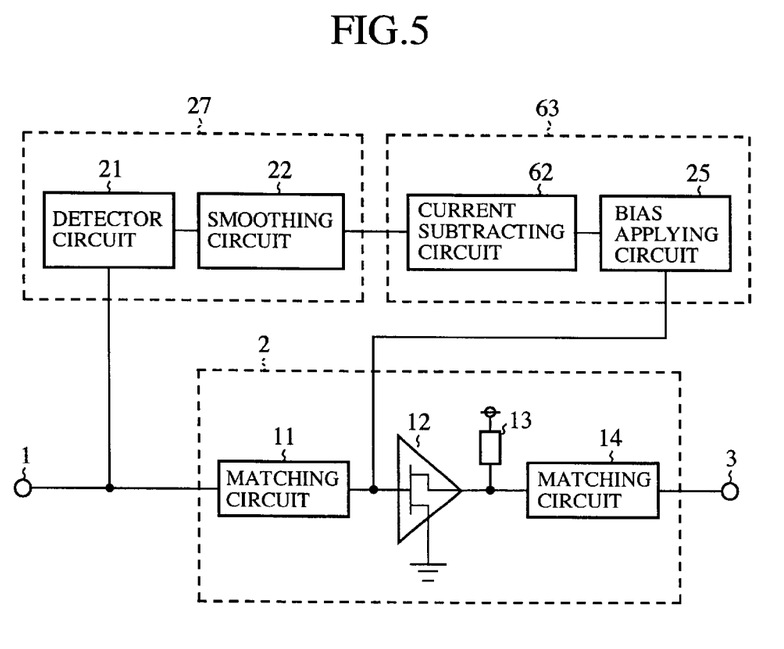
FIG. 5 is a block diagram showing a configuration of high-frequency amplifying device according to an embodiment 2 of the present invention.

FIG. 5 is a block diagram showing a configuration of the high-frequency amplifying device according to an embodiment 2 of the present invention. In the figure, reference numeral 62 indicates a current subtracting circuit for causing a current having a value corresponding to the amplitude of an input signal to be supplied by a bias applying circuit 25 based on a post-smoothing current. Incidentally, the current subtracting circuit 62 and the bias applying circuit 25 constitute a bias control circuit 63.

Incidentally, since other elements of structure in FIG. 5 are similar to those employed in the embodiment 1, description on them will be omitted. However, the bias applying circuit 25 subtracts the current supplied to the current subtracting circuit 62 from a reference current and applies a bias corresponding to the post-subtraction remaining current to the base of a transistor 12.

Figure 6:
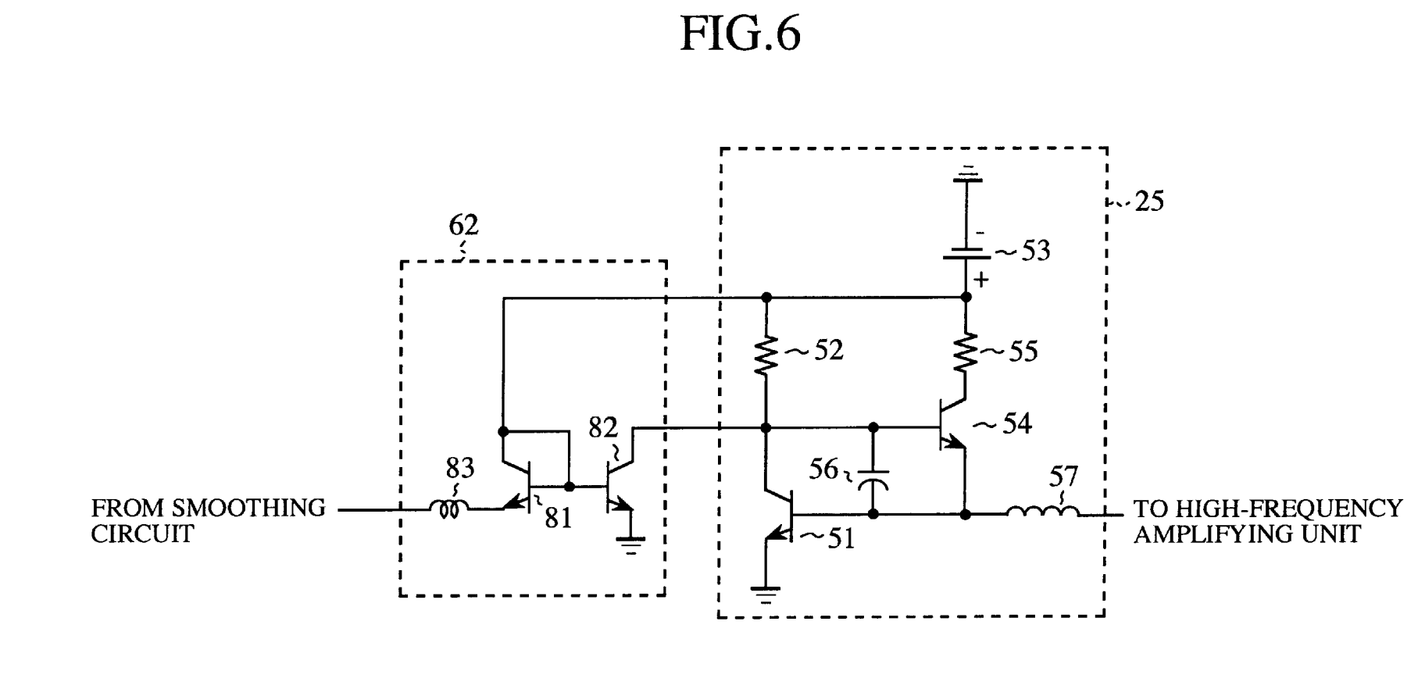
FIG. 6 is a circuit diagram showing an example illustrative of configurations of the current subtracting circuit and the bias applying circuit shown in FIG. 5.

An example illustrative of configurations of the current subtracting circuit 62 and the bias applying circuit 25 where an N type bipolar transistor is used as the transistor 12, will be shown hereafter. FIG. 6 is a circuit diagram showing example illustrative of the configurations of current subtracting circuit 62 and the bias applying circuit 25 shown in FIG. 5.

In the figure, reference numerals 81 and 82 respectively indicate N type transistors that constitute a current mirror circuit whose one end is connected to a smoothing circuit 22 through an inductor 83 and whose other end is connected to the bias applying circuit 25, and 83 indicates an inductor to suppress the flowing of high-frequency signal. Incidentally, the collectors of N type transistors 81 and 82 are connected to the same power supply 53 as the bias applying circuit 25. Incidentally, the bias applying circuit 25 in this case is similar to one shown in FIG. 3.

The operation will next be described.

Since the high-frequency amplifying unit 2 is operated in the manner similar to one employed in the embodiment 1, the description thereof will be omitted.

The detection circuit 21 detects the high-frequency signal supplied via the input terminal 1 and supplies the post-detection signal to the smoothing circuit 22. The smoothing circuit 22 smoothes the signal. The current subtracting circuit 62 causes the bias applying circuit 25 to supply a current of value corresponding to the amplitude of input signal through based on the post-smoothing signal. The bias applying circuit 25 subtracts the current supplied to the current subtracting circuit 62 from the reference current and applies a bias corresponding to the so-subtracted remaining current to the base of transistor 12. Thus when the amplitude of input signal increases, the post-subtraction remaining current decreases and the bias applied to the base of transistor 12 is reduced. On the other hand, when the amplitude of input signal decreases, the post-subtraction remaining current increases and the bias applied to the base of transistor 12 becomes large.

A description will now be made on operation in the case where the respective parts are configured as shown in FIG. 6.

First, the detector circuit 21 and the smoothing circuit 22 extract the voltage amplitude of an input signal and allow a current corresponding to it to conduct into the N type transistor 81 of current mirror circuit in the current subtracting circuit 62. Thus a current with a value obtained by multiplying the current with a ratio between junction areas of the N type transistors 81 and 82 is allowed to conduct into the N type transistor 82 of current mirror circuit. At this time, the current, which passes through the N type transistor 82, also passes from the bias applying circuit 25 to the current subtracting circuit 62.

In the bias applying circuit 25, a reference bias for an N type transistor 51 is determined according to a voltage from the power supply 53, a resistance value of resistor 52 and an emitter-to-base voltage of the N type transistor 54 when no current is supplied to the current subtracting circuit 62. A reference current corresponding to the reference bias serves to make continuity between the collector and emitter. When the current is supplied to the current subtracting circuit 62, the current is subtracted from the reference current, and the post-subtraction remaining current flows into the collector of N type transistor 51 of the bias applying circuit 25. The bias applied to the base of N type transistor 51 also varies by change in the emitter-to-collector current. Since the N type transistor 51 constitutes the current mirror circuit together with the transistor 12 of high-frequency amplifying unit 2, the bias applied to the base of transistor 12 of the high-frequency amplifying unit 2 also changes in the same manner as described above. Incidentally, the ratio between the emitter junction areas of current mirror circuit in the current subtracting circuit 62 is suitably set in the manner similar to the current adding circuit 24 employed in the embodiment 1, whereby characteristics of the current from the bias applying circuit 25 to the current subtracting circuit 62 can be set so that desired bias control on the transistor 12 is attained.

Thus the detector circuit 21, the smoothing circuit 22, the current subtracting circuit 62 and the bias applying circuit 25 continuously adjust the bias for the transistor 12 of high-frequency amplifying unit 2 according to the amplitude of input signal.

Thus according to the embodiment 2, an effect is obtained that a steep gain variation produce by a change in the amplitude of input high-frequency signal can be suppressed since the high-frequency amplifying unit 2 having the transistor 12 for amplifying the input high-frequency signal, the measuring circuit 27 for measuring the amplitude of input high-frequency signal, and the bias control circuit 63 for continuously controlling the bias applied to the transistor 12 according to the value of amplitude measured by the measuring circuit 27 are provided.

Further according to the embodiment 2, an effect is obtained that the bias can be increased continuously when the amplitude of input high-frequency signal is reduced, thus it makes possible to compensate for a gain reduction at low output power since the bias control circuit 63 has the current subtracting circuit 62 for inputting the current having the value corresponding to the amplitude measured by the measuring circuit 27, and the bias applying circuit 25 for supplying the current to the current subtracting circuit and applying the bias corresponding to the difference between a predetermined reference current and the current to the amplifying element. That is to say, when it is necessary to compensate for the gain reduction at low output power according to the type of device used in the transistor 12, the bias control circuit 63 is used, whereas when it is necessary to reduce power consumption at low output power, the bias control circuit 26 is used.

Furthermore according to the embodiment 2, an effect is obtained that the characteristics of current from the bias applying circuit 25 with respect to the amplitude of input high-frequency signal can easily be adjusted by adjusting the ratio between the junction areas of current mirror circuit, and hence the bias applied to the transistor 12 can be adjusted with ease, since the current subtracting circuit 62 has the current mirror circuit for allowing the current of value corresponding to the amplitude measured by the measuring circuit 27 to conduct into one end thereof and causing the current set based on the ratio between the junction areas of current mirror circuit to be input from the other end thereof according to the current.

Still further according to the embodiment 2, an effect is obtained that the measuring circuit 27 can measure the amplitude of high-frequency signal without degradation of the high-frequency signal supplied to the high-frequency amplifying unit 2, since the measuring circuit 27 is connected in parallel with the high-frequency amplifying unit 2.

Embodiment 3

Figure 7:
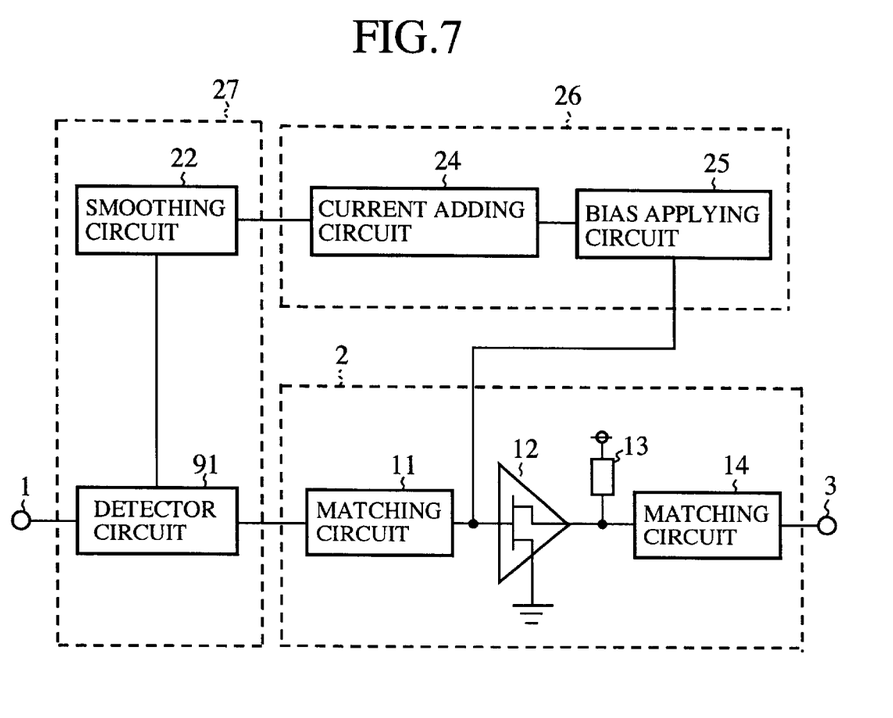
FIG. 7 is a block diagram showing a configuration of high-frequency amplifying device according to an embodiment 3 of the present invention.
Figure 8:
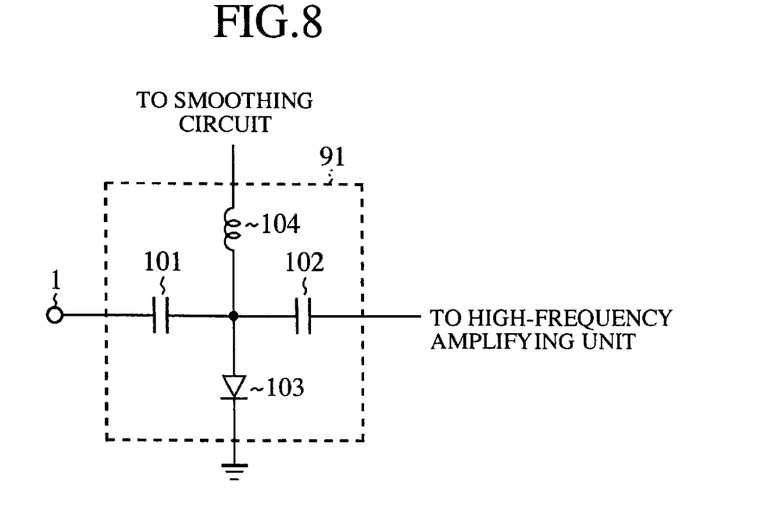
FIG. 8 is a circuit diagram showing an example of configuration of the detector circuit shown in FIG. 7.

FIG. 7 is a block diagram showing a configuration of the high-frequency amplifying device according to an embodiment 3 of the present invention. FIG. 8 is a circuit diagram showing an example of configuration of the detector circuit 91 shown in FIG. 7. In the figure, reference numeral 91 indicates the detector circuit for passing a high-frequency signal to a high-frequency amplifying unit 2 and detecting the high-frequency signal. In the detector circuit 91, reference numeral 101 indicates a capacitor connected to the input terminal 1, for allowing the high-frequency signal to pass through and suppressing a dc component or the like, 102 indicates a capacitor connected to the high-frequency amplifying unit 2, for allowing the high-frequency signal to pass through and suppressing a dc component or the like, 103 indicates a detecting diode, and 104 indicates an inductor for suppressing a high-frequency component with respect to a smoothing circuit 22, respectively. Incidentally, since other elements of structure shown in FIG. 7 are respectively similar to those employed in the embodiment 1, the description thereof will be omitted.

The operation will next be described.

The detector circuit 91 supplies the input high-frequency signal to the high-frequency amplifying unit 2 through the capacitors 101 and 102. Incidentally, the high-frequency signal input thereto at this time is cut or blocked off by the inductor 104 and is hence not supplied to the smoothing circuit 22. On the other hand, since a component of the input high-frequency signal, which is detected by the diode 103, is of a low frequency, it is supplied to the smoothing circuit 22 through the inductor 104. Incidentally, since other operations are similar to those in the embodiment 1, the description thereof will be omitted.

Thus according to the embodiment 3, an effect is obtained in addition to the effect obtained in the embodiment 1 that it is unnecessary to additionally provide a divider for allowing the high-frequency signal to divide to the measuring circuit 27 and high-frequency amplifying unit 2, thus it makes possible to reduce a circuit scale, since the detector circuit 91 is connected in series with the high-frequency amplifying unit 2, passes the high-frequency signal to the high-frequency amplifying unit 2, and detects the high-frequency signal. Incidentally, other embodiments can also attain similar effects according to a change from the detector circuit 21 to the detector circuit 91.

Embodiment 4

Figure 9:
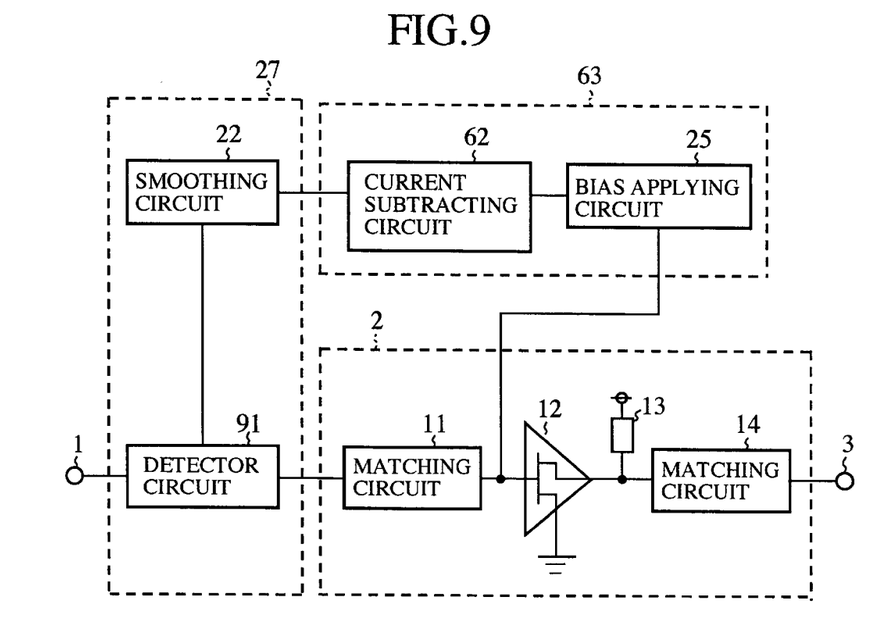
FIG. 9 is a block diagram showing a configuration of high-frequency amplifying device according to an embodiment 4 of the present invention.

FIG. 9 is a block diagram showing a configuration of the high-frequency amplifying device according to an embodiment 4 of the present invention. The high-frequency amplifying device according to the embodiment 4 is one wherein the detector circuit 21 according to the embodiment 2 is changed to the aforementioned detector circuit 91. Incidentally, since other elements of structure in FIG. 9 are similar to those employed in the embodiment 2, the description thereof will be omitted.

The operation will next be described.

The detector circuit 91 is operated in the manner similar to one employed in the embodiment 3. Incidentally, since other operations are similar to those employed in the embodiment 2, the description thereof will be omitted.

According to the embodiment 4 as described above, an effect is obtained in addition to the effect obtained by the embodiment 2 that it is unnecessary to additionally provide a divider for allowing the high-frequency signal to divide to a measuring circuit 27 and the high-frequency amplifying unit 2, thus it makes possible to reduce a circuit scale since the detector circuit 91 is connected in series with the high-frequency amplifying unit 2, passes the high-frequency signal to the high-frequency amplifying unit 2, and detects the high-frequency signal.

Embodiment 5

Figure 10:
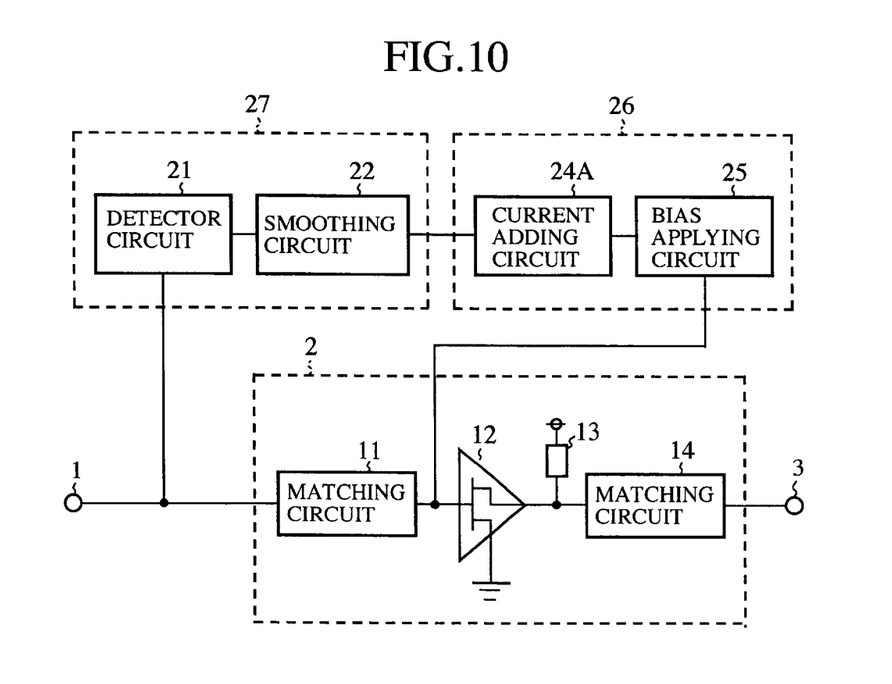
FIG. 10 is a block diagram showing a configuration of high-frequency amplifying device according to an embodiment 5 of the present invention.

FIG. 10 is a block diagram showing a configuration of the high-frequency amplifying device according to an embodiment 5 of the present invention. In the figure, reference numeral 24A indicates a current adding circuit capable of adjusting the voltage of power supply connected to a built-in current mirror circuit to thereby control a current supplied to the bias applying circuit 25. Incidentally, since other elements of structure in FIG. 10 are similar to those employed in the embodiment 1, the description thereof will be omitted.

Figure 11:
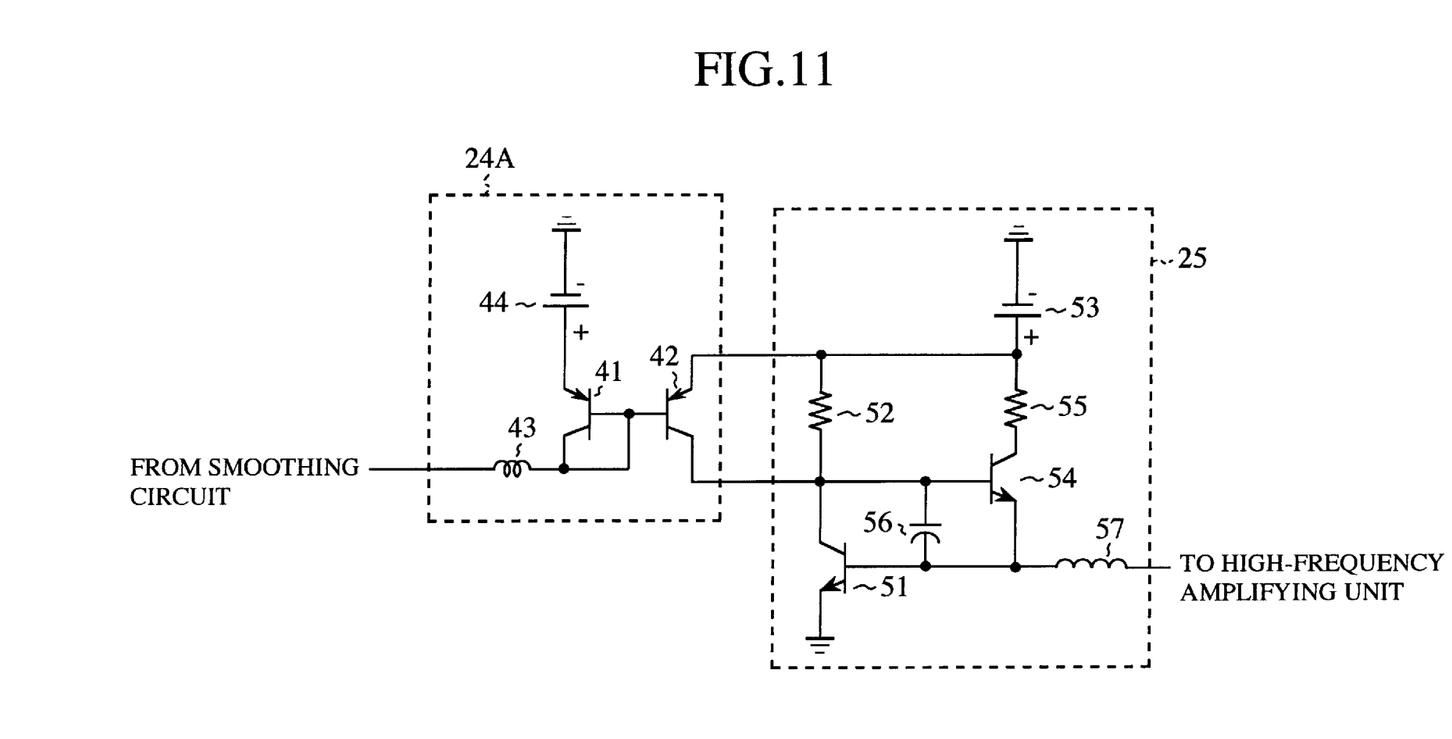
FIG. 11 is a circuit diagram showing an example illustrative of configurations of the current adding circuit and the bias applying circuit shown in FIG. 10.

An example illustrative of configurations of the current adding circuit 24A and the bias applying circuit 25 in the case where an N type bipolar transistor is used as a transistor 12, is shown hereafter. FIG. 11 is a circuit diagram showing the example illustrative of configurations of the current adding circuit 24A and the bias applying circuit 25 shown in FIG. 10.

In the current adding circuit 24A shown in FIG. 11, reference numeral 44 indicates a power supply connected to a collector of P type transistor 41. Incidentally, since other elements of structure in FIG. 11 are similar to those shown in FIG. 3, the description thereof will be omitted.

The operation will next be described.

In the high-frequency amplifying device according to the embodiment 5, the current supplied by the current adding circuit 24A to the bias applying circuit 25 can be controlled by adjusting the voltage of power supply 44 connected to the built-in current mirror circuit. Incidentally, since other operations are similar to those employed in the embodiment 1, the description thereof will be omitted.

Figure 12:
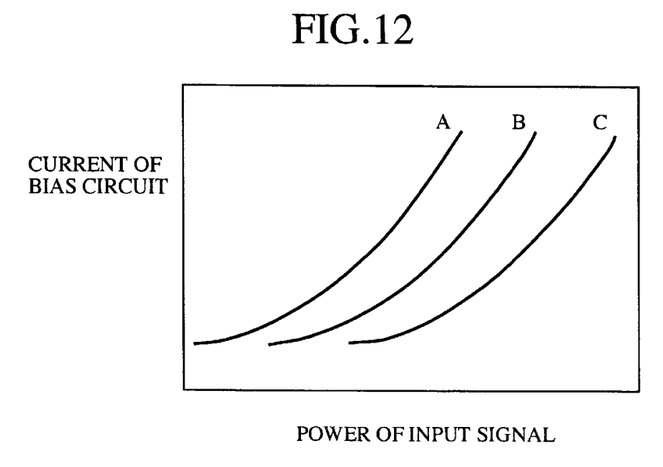
FIG. 12 is a diagram typically showing one example illustrative of characteristics of current passing an N type transistor of the bias applying circuit employed in the embodiment 5.

FIG. 12 is a diagram typically showing one example illustrative of characteristics of current passing the N type transistor 51 of bias applying circuit 25 employed in the embodiment 5. In the drawing, the characteristic B shows the relationship between the power of an input signal and the current passing the N type transistor 51 where the voltage of power supply is of a predetermined reference value. The characteristic A indicates the relationship between the power of an input signal and the current passing the N type transistor 51 where the voltage of power supply is reduced. The characteristic C shows the relationship between the power of an input signal and the current passing the N type transistor 51 where the voltage of power supply is increased. Thus desired bias control on the transistor 12 can be implemented by suitably setting the voltage of power supply 44.

Incidentally, since other operations are similar to those employed in the embodiment 1, the description thereof will be omitted.

According to the embodiment 5 as described above, an effect is obtained in addition to the effect obtained in the embodiment 1 that the characteristics of current to the bias applying circuit 25 with respect to the amplitude of input high-frequency signal can be adjusted easier by adjusting the ratio between the junction areas of current mirror circuit and the voltage of power supply, and hence the bias applied to the transistor 12 can be adjusted with ease, since the current adding circuit 24A has the current mirror circuit for allowing the current of value corresponding to the amplitude measured by the measuring circuit to conduct into one end thereof and outputting a current set based on the ratio between the junction areas of current mirror circuit and the voltage of power supply from the other end thereof according to the above current. That is to say, if the power supply 44 is a variable voltage source, then the adjustment of device can easily be implemented.

Embodiment 6

Figure 13:
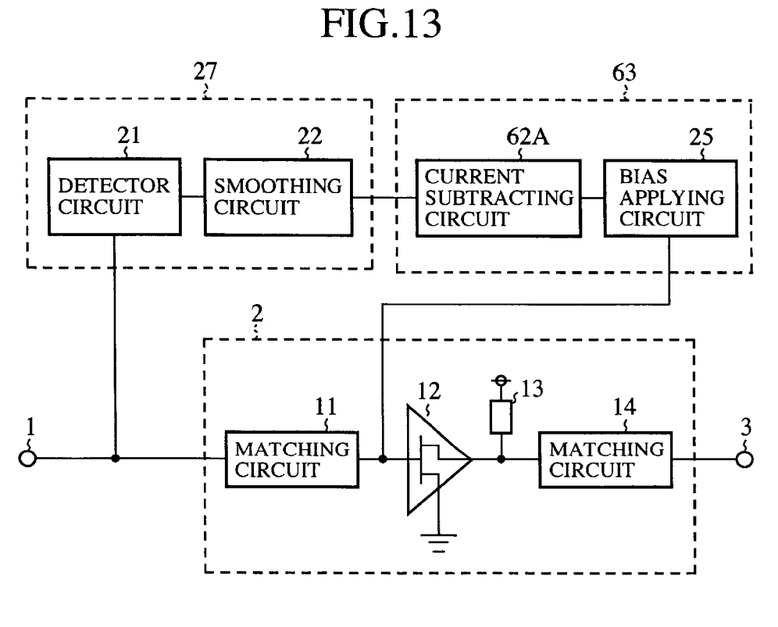
FIG. 13 is a block diagram showing a configuration of high-frequency amplifying device according to an embodiment 6 of the present invention.

FIG. 13 is a block diagram showing a configuration of the high-frequency amplifying device according to an embodiment 6 of the present invention. In the drawing, reference numeral 62A indicates a current subtracting circuit capable of adjusting the voltage of power supply connected to a built-in current mirror circuit to thereby control a current supplied by a bias applying circuit 25. Incidentally, since other elements of structure in FIG. 13 are similar to those employed in the embodiment 2, the description thereof will be omitted.

Figure 14:
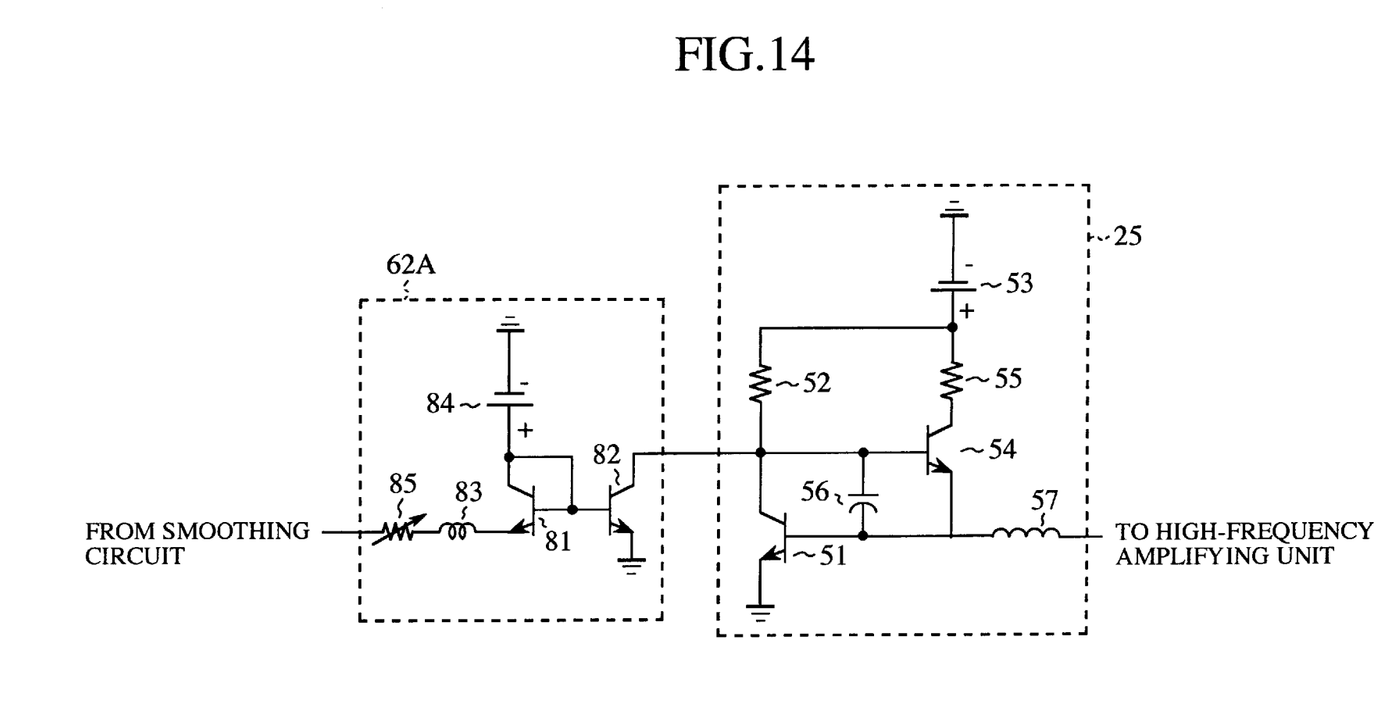
FIG. 14 is a circuit diagram showing an example illustrative of configurations of the current subtracting circuit and the bias applying circuit shown in FIG. 13.

An example illustrative of configurations of the current subtracting circuit 62A and the bias applying circuit 25 in the case where an N type bipolar transistor is used as a transistor 12, will be shown hereafter. FIG. 14 is a circuit diagram showing an example illustrative of the configurations of current subtracting circuit 62A and the bias applying circuit 25 in FIG. 13. In the current subtracting circuit 62A shown in FIG. 14, reference numeral 84 indicates a power supply connected to the collector of N type transistor 81. Incidentally, since other elements of structure in FIG. 14 are similar to those shown in FIG. 6, the description thereof will be omitted.

The operation will next be described.

In the high-frequency amplifying device according to the embodiment 6, the current supplied by the current adding circuit 25 to the current subtracting circuit 62A can be controlled by adjusting the voltage of power supply 84 connected to the built-in current mirror circuit. Thus the characteristics of current from the bias applying circuit 25 to the current subtracting circuit 62A can be set by suitable setting of the voltage of power supply 84 so that desired bias control on the transistor 12 is attained. Incidentally, since other operations are similar to those employed in the embodiment 2, the description thereof will be omitted.

According to the embodiment 6 as described above, an effect is obtained that the characteristics of current from the bias applying circuit 25 with respect to the amplitude of input high-frequency signal can be adjusted easier by adjusting the ratio between the junction areas of current mirror circuit and the voltage of power supply, and hence the bias applied to the transistor 12 can be adjusted with ease, since the current subtracting circuit 62A has the current mirror circuit for allowing a current with a value corresponding to the amplitude measured by the measuring circuit 27 to conduct into one end thereof and inputting a current set based on the ratio between junction areas of the current mirror circuit and the voltage of power supply from the other end thereof according to the above current. That is to say, if the power supply 84 is a variable voltage source, then the adjustment of device can easily be carried out.

Embodiment 7

Figure 15:
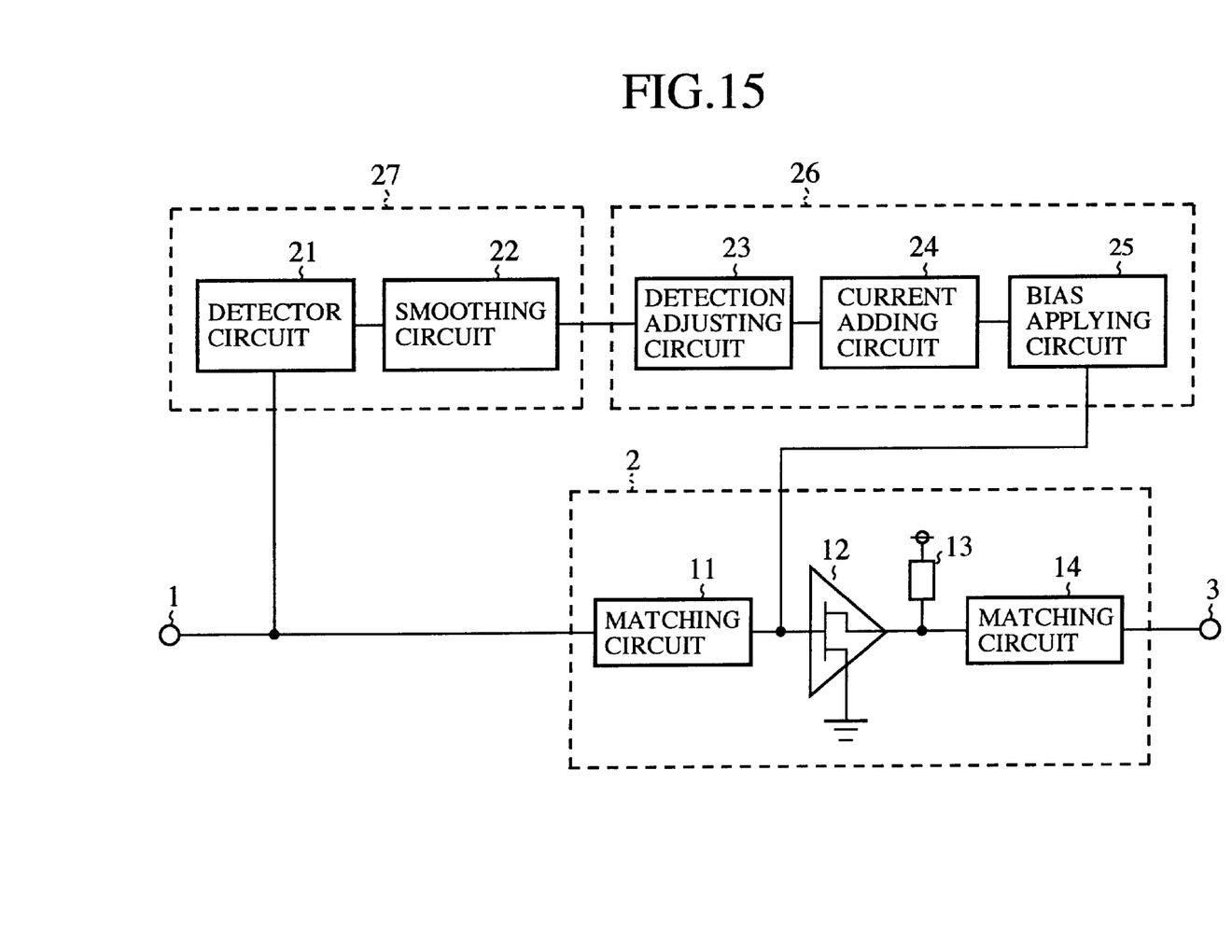
FIG. 15 is a block diagram showing a configuration of high-frequency amplifying device according to an embodiment 7 of the present invention.

FIG. 15 is a block diagram showing a configuration of the high-frequency amplifying device according to an embodiment 7 of the present invention. In the figure, reference numeral 23 indicates a detection adjusting circuit provided between the smoothing circuit 22 and the current adding circuit 24, for adjusting a current passing the detector circuit 21 and the smoothing circuit 22. Incidentally, since other elements of structure in FIG. 15 are similar to those employed in the embodiment 1, the description thereof will be omitted.

Figure 16:
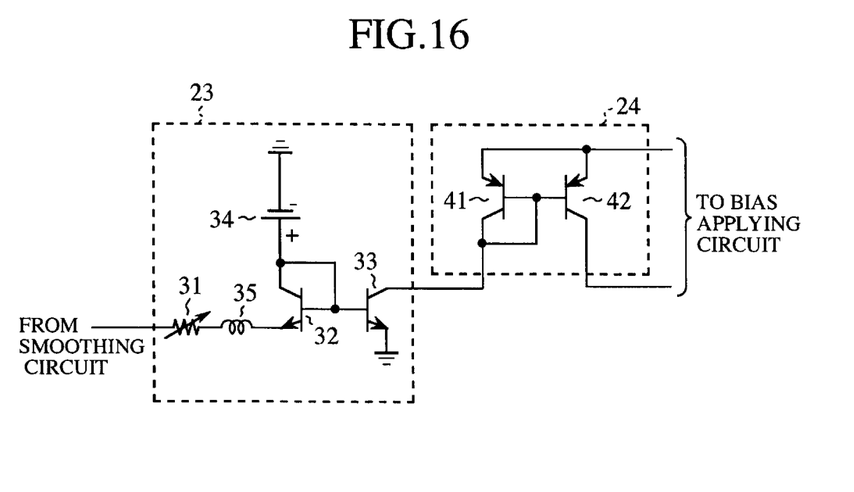
FIG. 16 is a circuit diagram showing an example illustrative of configurations of detection adjusting circuit and a current adding circuit shown in FIG. 15.

An example illustrative of configurations of the detection adjusting circuit 23 and the current adding circuit 24 in the case where an N type bipolar transistor is used as the transistor 12, will be shown hereafter. FIG. 16 is a circuit diagram showing an example illustrative of configurations of the detection adjusting circuit 23 and the current adding circuit 24 in FIG. 15.

In the detection adjusting circuit 23 shown in FIG. 16, reference numeral 31 indicates a variable resistor provided between an N type transistor 32 and the smoothing circuit 22, 32 and 33 respectively indicate N type transistors that constitute a current mirror circuit whose one end is connected to the variable resistor 31 and whose other end is connected to the current adding circuit 24, 34 indicates a power supply connected to the collector and base of N type transistor 32 and the base of N type transistor 33, and 35 indicates an inductor for suppressing the flowing of high-frequency signal, which is used as an alternative to an inductor 43 in the current adding circuit 24. In the current mirror circuit, currents pass through one end thereof and the other end thereof at the same ratio as that between junction areas of the transistors. Incidentally, the bias applying circuit 25 in this case is similar to one shown in FIG. 3.

The operation will next be described.

The detector circuit 21 detects the high-frequency signal supplied via the input terminal 1 and supplies the post-detection signal to the smoothing circuit 22. The smoothing circuit 22 smoothes the signal. At this time, the detection adjusting circuit 23 connected to the smoothing circuit 22 adjusts a current passing through the detector circuit 21 and the smoothing circuit 22. The current adding circuit 24 supplies a current with a value corresponding to the amplitude of input signal to the bias applying circuit 25, based on the current adjusted by the detection adjusting circuit 23. Incidentally, since other operations are similar to those in the embodiment 1, the description thereof will be omitted.

A description will now be made on operation when the respective parts are configured as shown in FIG. 16.

First, the detector circuit 21 and the smoothing circuit 22 extract the voltage amplitude of input signal and allow a current corresponding to the voltage amplitude of input signal to conduct into the N type transistor 32 of current mirror circuit, based on the resistance value of variable resistor 31 and the voltage of power supply 34. Thus a current having a value obtained by multiplying the current with a ratio between junction areas of the N type transistors 32 and 33 conducts into the N type transistor 33 of current mirror circuit.

The same current conducts even into the P type transistor 41 of current mirror circuit in the current adding circuit 24, which is connected to the N type transistors 33. Thus a current having a value obtained by multiplying the current with a ratio between junction areas of the P type transistors 41 and 42 conducts into the P type transistor 42 of current mirror circuit. Subsequently, the bias applying circuit 25 in this case is operated in the manner similar to the embodiment 1.

According to the embodiment 7 as described above, an effect is obtained in addition to the effect obtained in the embodiment 1 that an operating condition (an operating point of the diode that constitutes the detector circuit 21) for the measuring circuit 27 can be controlled, and hence an adjustment of the device can easily be performed, since the bias control circuit 26 has the detection adjusting circuit 23 for setting the value of conducting current according to the amplitude of high-frequency signal when the measuring circuit 27 measures the amplitude thereof.

According to the embodiment 7 as well, an effect is obtained that the measuring circuit 27, the detection adjusting circuit 23 and the current adding circuit 24 can be implemented in a one-chip integrated circuit, thus it makes possible to reduce the scale and cost of device, since the measuring circuit 27, the detection adjusting circuit 23 and the current adding circuit 24 are connected in parallel with the high-frequency amplifying unit.

Incidentally, other embodiments can also attain similar effect by providing the detection adjusting circuit 23.

Embodiment 8

Figure 17:
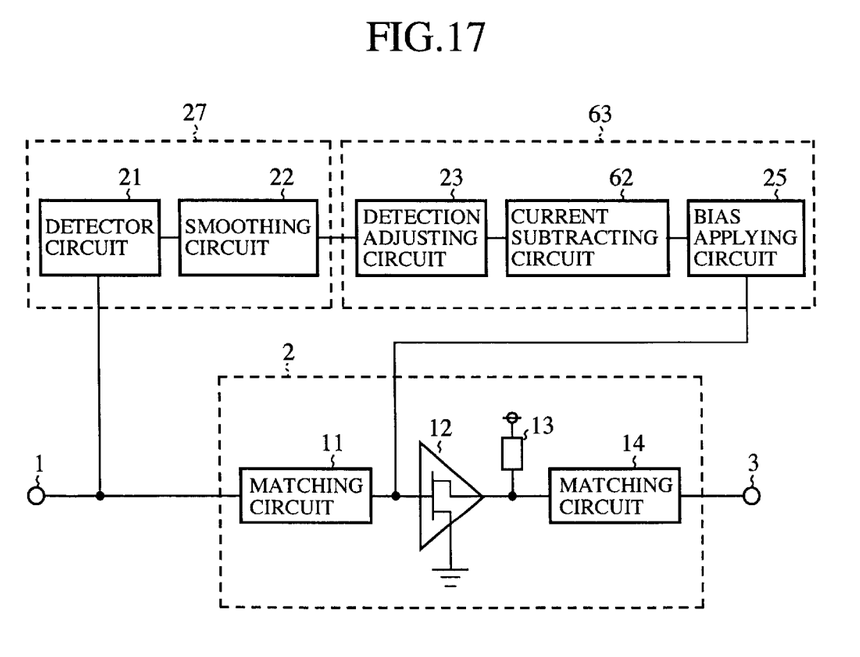
FIG. 17 is a block diagram showing a configuration of high-frequency amplifying device according to an embodiment 8 of the present invention.

FIG. 17 is a block diagram showing a configuration of the high-frequency amplifying device according to an embodiment 8 of the present invention. In the figure, the high-frequency amplifying device according to the embodiment 8 is one wherein the aforementioned detection adjusting circuit 23 is added to the high-frequency amplifying device according to the embodiment 2. Thus since elements of structure other than the detection adjusting circuit 23 in FIG. 17 are similar to those employed in the embodiment 2, the description thereof will be omitted.

The operation will next be described.

A detector circuit 21 detects the high-frequency signal supplied via the input terminal 1 and supplies the post-detection signal to the smoothing circuit 22. The smoothing circuit 22 smoothes the signal. At this time, the detection adjusting circuit 23 connected to the smoothing circuit 22 adjusts the current passing the detector circuit 21 and the smoothing circuit 22. The current subtracting circuit 24 causes the bias applying circuit 25 to supply a current with value corresponding to the amplitude of input signal, based on the current adjusted by the detection adjusting circuit 23. Incidentally, since other operations are similar to those in the embodiment 2, the description thereof will be omitted.

According to the embodiment 8 as described above, an effect is obtained in addition to the effect obtained in the embodiment 2 that an operating condition (an operating point of the diode that constitutes the detector circuit 21) for the measuring circuit 27 can be controlled, and hence an adjustment of the device can easily be carried out, since the bias control circuit 63 has the detection adjusting circuit 23 for setting the value of conducting current according to the amplitude of high-frequency signal when the measuring circuit 27 measures the amplitude thereof.

According to the embodiment 8 as well, an effect is obtained that the measuring circuit 27, the detection adjusting circuit 61 and the current subtracting circuit 62 can be implemented in a one-chip integrated circuit, thus it makes possible to reduce the scale and cost of device, since the measuring circuit 27, the detection adjusting circuit 61 and the current subtracting circuit 62 are connected in parallel with the high-frequency amplifying unit 2.

Incidentally, while the above-described embodiment has been explained the case in which the N type bipolar transistor is used as the amplifying element for the high-frequency amplifying unit 2 by way of example, other type of transistors or the like such as a field effect transistor may be used as the amplifying element for the high-frequency amplifying unit 2. However, in such a case internal circuit configurations of the bias control circuits 26 and 63 must be changed correspondingly.

INDUSTRIAL APPLICABILITY

As described above, for example, a communication apparatus for transmitting and receiving a high-frequency signal is suitable for use in amplification of the high-frequency signal.

What is claimed is:

1. A high-frequency amplifying device for amplifying a high-frequency signal with a one-stage amplifying element, comprising:
   a high-frequency amplifying unit including an amplifying element configured to amplify the input high-frequency signal;
   a measuring circuit configured to measure amplitude of said input high-frequency signal; and
   a bias control circuit configured to control continuously a bias applied to the amplifying element according to value of said amplitude measured by said measuring circuit, comprising,
      a current adding circuit configured to output a current having a value corresponding to the amplitude measured by said measuring circuit,
      a bias applying circuit configured to apply a bias corresponding to sum of the current output from said current adding circuit and a predetermined reference current to the amplifying element, and
      a detection adjusting circuit configured to set value of conducting current according to amplitude of the high-frequency signal when said measuring circuit measures the amplitude thereof.

2. A high-frequency amplifying device for amplifying a high-frequency signal with a one-stage amplifying element, comprising:
   a high-frequency amplifying unit including an amplifying element configured to amplify the input high-frequency signal;
   a measuring circuit configured to measure amplitude of said input high-frequency signal; and
   a bias control circuit configured to control continuously a bias applied to the amplifying element according to value of said amplitude measured by said measuring circuit, comprising,
      a current adding circuit configured to output a current having a value corresponding to the amplitude measured by said measuring circuit,
      a bias applying circuit configured to apply a bias corresponding to sum of the current output from said current adding circuit and a predetermined reference current to the amplifying element, and
      an internal amplifying element configured to conduct the current output from the current adding circuit and the predetermined reference current, and the internal amplifying element and the amplifying element of said high-frequency amplifying unit constitute a current mirror circuit.

3. A high-frequency amplifying device for amplifying a high-frequency signal with a one-stage amplifying element, comprising:
   a high-frequency amplifying unit including an amplifying element configured to amplify the input high-frequency signal;
   a measuring circuit configured to measure amplitude of said input high-frequency signal; and
   a bias control circuit configured to control continuously a bias applied to the amplifying element according to value of said amplitude measured by said measuring circuit, comprising,
      a current subtracting circuit configured to input thereto a current having a value corresponding to the amplitude measured by said measuring circuit,
      a bias applying circuit configured to supply the current to the current subtracting circuit and to apply a bias corresponding to a difference between a predetermined reference current and said current to the amplifying element, and
      a detection adjusting circuit configured to set a value of conducting current according to the amplitude of high-frequency signal when said measuring circuit measures the amplitude thereof.

4. A high-frequency amplifying device for amplifying a high-frequency signal with a one-stage amplifying element, comprising:
   a high-frequency amplifying unit including an amplifying element configured to amplify the input high-frequency signal;
   a measuring circuit configured to measure amplitude of said input high-frequency signal; and
   a bias control circuit configured to control continuously a bias applied to the amplifying element according to value of said amplitude measured by said measuring circuit, comprising,
      a current subtracting circuit configured to input thereto a current having a value corresponding to the amplitude measured by said measuring circuit,
      a bias applying circuit configured to supply the current to the current subtracting circuit and to apply a bias corresponding to a difference between a predetermined reference current and said current to the amplifying element, and
      an internal amplifying element for conducting the remaining current obtained by subtracting the current supplied to the current subtracting circuit from the predetermined reference current, and the internal amplifying element and the amplifying element of said high-frequency amplifying unit constitute a current mirror circuit.

5. The high-frequency amplifying device according to claim 1, wherein said measuring circuit, said current adding circuit and said detection adjusting circuit are connected in parallel with said high-frequency amplifying unit.

6. The high-frequency amplifying device according to claim 3, wherein said measuring circuit, said current subtracting circuit and said detection adjusting circuit are connected in parallel with said high-frequency amplifying unit.

7. A high-frequency amplifying device for amplifying a high-frequency signal with a one-stage amplifying element, comprising:
   a high-frequency amplifying unit including an amplifying element configured to amplify the input high-frequency signal;
   a measuring circuit configured to measure amplitude of said input high-frequency signal; and
   a bias control circuit configured to control continuously a bias applied to the amplifying element according to value of said amplitude measured by said measuring circuit, comprising,
      a detector circuit connected in series with said high-frequency amplifying unit, and configured to pass a high-frequency signal to said high-frequency amplifying unit and to detect the high-frequency signal.

* * * * *